United States Patent [19]
Takahashi et al.

[11] Patent Number: 5,234,359
[45] Date of Patent: Aug. 10, 1993

[54] TERMINAL DEVICE FOR ELECTRICAL CONNECTION

[75] Inventors: Hideyuki Takahashi; Koji Takeda, both of Hyogo, Japan

[73] Assignee: Hewlett-Packard Company, Palo Alto, Calif.

[21] Appl. No.: 936,899

[22] Filed: Aug. 27, 1992

[30] Foreign Application Priority Data

Aug. 28, 1991 [JP] Japan ................... 3-76305[U]

[51] Int. Cl.⁵ ............................................. H01R 13/00
[52] U.S. Cl. .................................... 439/481; 439/729
[58] Field of Search ............... 439/477, 478, 481, 482, 439/578, 581, 729, 817, 824

[56] References Cited

U.S. PATENT DOCUMENTS

| | | | |
|---|---|---|---|
| 2,677,117 | 4/1954 | Swain | 439/729 |
| 3,201,746 | 8/1965 | Askew | 439/729 |
| 3,864,629 | 2/1975 | Danna | 439/481 |
| 4,390,233 | 6/1983 | Sanders, Jr. | 439/729 |

OTHER PUBLICATIONS

Hewlett-Packard Milliohmmeter 4328A Operating and Service Manual, Yokogawa-Hewlett-Packard, Ltd., Jan. 1982, pp. 2-5-3-7.
Honda, M. "The Impedance Measurement Handbook", Yokogawa-Hewlett-Packard, Ltd., May 1989, pp. 3-1-3-3.

Primary Examiner—Daniel W. Howell
Assistant Examiner—Hien D. Vu

[57] ABSTRACT

This invention provides a terminal device for electrical connection to a lead section to be measured. The LCR measurement is easily and accurately taken with a single operation even when a space between lead sections to be measured is narrow. Thereby, an efficiency of the LCR measurement with the Kelvin connection is enhanced.

An electroconductive pin is slidably inserted into a fine insulating housing. A hook-shaped terminal section is formed at the tip of the electroconductive pin. The electroconductive pin is urged by a spring in such a direction that the hook-shaped terminal section is retracted into the insulating housing and a lead section to be measured is engaged by the hook-shaped terminal section and a fixed terminal. The fixed terminal is provided at the tip of the insulating case so as to oppose the inner surface of the hook-shaped terminal portion. Two lead wires are respectively connected to the electroconductive pin and the fixed terminal at the rear end of the insulating housing.

6 Claims, 3 Drawing Sheets

TERMINAL DEVICE FOR ELECTRICAL CONNECTION

FIELD OF THE INVENTION

This invention generally relates to a terminal device for electrically connecting a test clip for LCR measurements of a device under test (DUT), such as a semiconductor device, coil, condenser, resistor, etc., and more particularly relates to a terminal device for electrical connection suitable for the Kelvin connection (four-terminal connection).

BACKGROUND OF THE INVENTION

For measuring inductance L, static capacitance C and resistance R between two terminals of a semiconductor device or L, C, R of a single electric element, a pinch-type connecting terminal or a test clip has been frequently utilized. The test clip is connected to a measuring apparatus via lead wire and clips onto a lead section, a pin or the like of the DUT, (hereinafter referred to as "lead section to be measured").

FIG. 1 shows a test clip which has been conventionally used in general measurements. This test clip includes an electroconductive pin 2 which is slidably inserted into the insulating housing 1 and the hook-shaped terminal section 3 at a tip of the electroconductive pin 2 which can be retractably movable in and out of the tip of the insulating housing 1. The electroconductive pin 2 is urged by a spring in such a direction that the hook-shaped terminal section 3 is retracted towards one end of the insulating housing 1. The electroconductive pin 2 is ultimately connected to a measuring apparatus (not shown) via the lead wire 5, which is disposed in the pusher 4. The pusher 4 is located at one end of the electroconductive pin 2.

The hook-shaped terminal section 3 of the test clip can be moved away from the insulating housing 1 by pushing the pusher 4 toward insulating housing 1, and the hook-shaped terminal section 3 then engages a lead section to be measured 6 of the DUT. Accordingly, when the pusher 4 is released, the lead section to be measured 6 is urged by hook-shaped terminal section 3 and a tip of insulating housing 1.

FIG. 2 shows an application of the conventional test clip of FIG. 1 to which the LCR measuring apparatus is connected for measuring selected impedance of the DUT 31 through the Kelvin (four-terminal) connection. The Kelvin configuration for an impedance measurement has been understood by those skilled in the art. A comparison of various configurations for such an impedance measurement is, for instance, described in "The Impedance Measurement Handbook" published in May 1989 by Hewlett-Packard company p. 3-1, 3-3.

Since it is necessary to connect a current supply terminal and a voltage measurement terminal of the LCR measuring apparatus 9 with two lead sections 6 of the DUT 31, two test clips shown in FIG. 1 are required for each lead section 6. Thus, a total of 4 test clips must be utilized.

In FIG. 2, $a_{1i}$ and $a_{2i}$ are connection points for supplying current from the LCR measuring apparatus 9 to the DUT 31. $a_{1v}$ and $a_{2v}$ are connection points for measuring a voltage across the DUT 31 in response to the supplied current to obtain impedance of the DUT 31. Since four test clips are used for connecting these points, lead wires between $a_{1v}$ and $a_{1i}$ or $a_{2v}$ and $a_{2i}$ provide an additional resistance to such voltage measurements. This will cause an error in voltage measurement of the DUT. Accordingly, such connecting device which allow a more precise voltage measurement at points $a_{1v}$ and $a_{2v}$ has been desired. However, certain DUT's may not have enough room for two of such test clips. Even though they could be connected, such arrangement becomes time-consuming and laborious. Further, wiring of four test clips may cause an error in connection.

In order to overcome the above problems, an alligator-type test clip having two terminals 7a and 7b as shown in FIG. 3 has been used. The alligator-type test clip may be utilized in the Kelvin connection respectively by connecting lead wires 8a and 8b to a current and voltage terminal of the LCR measuring apparatus respectively (not shown), and a connecting lead section to be measured 6 to terminals 7a and 7b, which are in turn conductively connected to the lead wires 8a and 8b.

However, in order to keep their rigidity, terminals 7a and 7b must contain an electroconductive plate material of some thickness (for example, approximately 0.8 mm) so as to open the terminals 7a and 7b at a suitable angle. Both tips of the terminals 7a and 7b must be apart at least for a distance of approximately 5 mm for connecting a lead section to be measured 6. Accordingly, when a lead-to lead pitch (i.e. the distance between two lead sections 6 in FIG. 3) is smaller than approximately 5 mm, the size of the above described clip is too large for connection. In addition, this type of test clips may not firmly stay on the lead section to be measured due to their structure.

SUMMARY OF THE INVENTION

One object of this invention is to provide a terminal device for an easy and accurate electrical connection to a lead section to be measured of the DUT.

Another object of the invention is to provide a connection to closely disposed lead sections to be measured.

It is yet another object of the invention to provide an efficient LCR measurement, particularly for the Kelvin connection.

A terminal device of the present invention for connecting an electrical terminal may include an electroconductive pin which is slidably inserted into a insulating housing, a hook-shaped terminal section formed at a tip of the electroconductive pin which is retractably movable along the axis of the insulating housing, a spring urging the electroconductive pin in such direction that hook-shaped terminal section is retracted into the insulating housing, wherein fixed terminals are provided at the tip of the insulating housing so as to oppose an inner surface of the hook-shaped terminal section, and different lead wires are respectively connected to the electroconductive pin and fixed terminal, at a rear end of the insulating housing.

When a terminal device of this invention is connected to the DUT by manually applying a force to the pusher of the device, the hook-shaped terminal section of the electroconductive pin is protruded from the insulating housing against an elastic force of the spring. Then, the hook-shaped terminal section is hooked on the lead section of the DUT. Thereafter, by terminating the force against the pusher, the lead section to be measured is engaged by the hook-shaped terminal section and fixed terminal opposing the hook-shaped terminal section.

With a one-point contact to the lead section to be measured as described above for the LCR measurement, a terminal device can be connected to both a current supply terminal and voltage measurement terminal via lead wires which are respectively extended from the electroconductive pin and the fixed terminal.

Further, even where a space between two adjacent lead sections to be measured is narrow, such a single contact can be utilized by engaging the hook-shaped terminal portion with the lead section to be measured. Since a connection to two terminals (current supply terminal and voltage measuring terminal for LCR measurement) can be accomplished by the one-point contact, this invention allows an ideal Kelvin connection and enhances the measurement efficiency.

DETAILED DESCRIPTION OF THE PREFERRED EMBODIMENTS

Figure 1:
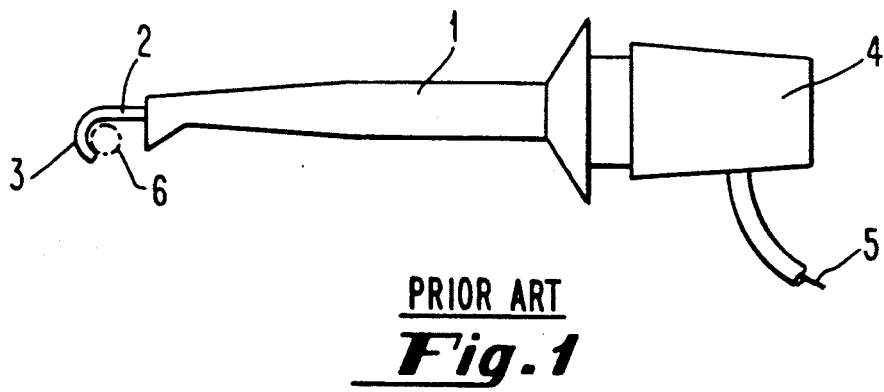
FIG. 1 is a perspective view of an example of a conventional terminal device.
Figure 2:
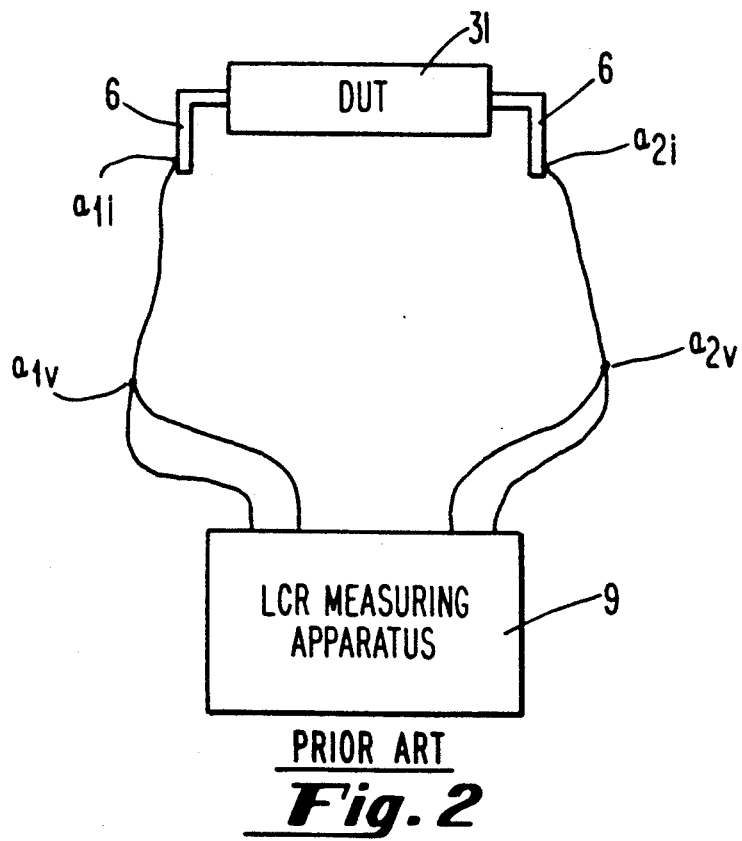
FIG. 2 shows a disadvantage of the terminal device of FIG. 1 as applied to the Kelvin connection with the LCR measuring apparatus.
Figure 3:
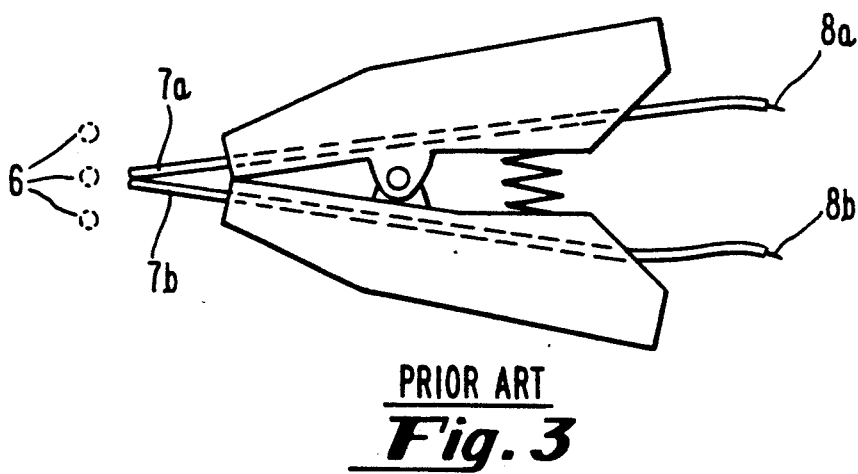
FIG. 3 is a perspective view of another conventional terminal device.
Figure 4:
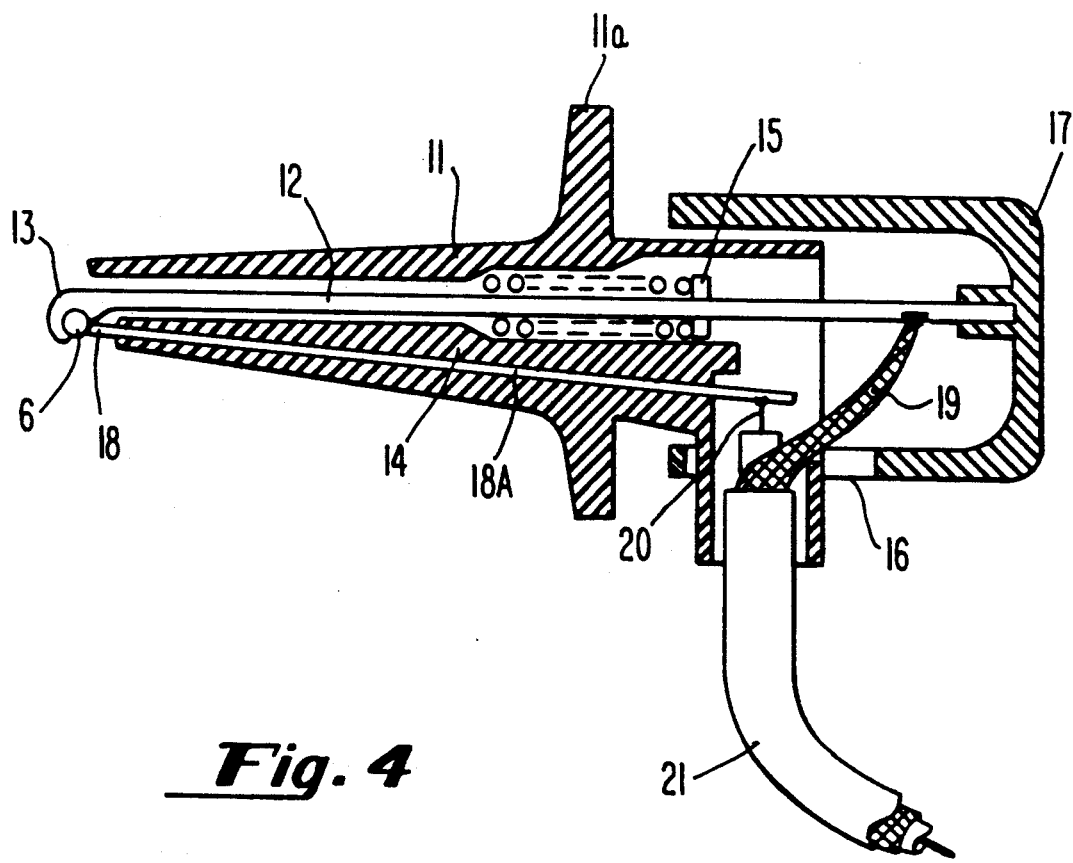
FIG. 4 is a cross-sectional view of a connecting terminal device of the present invention.

Preferred embodiments of the present invention will be described with reference to FIGS. 4-7. As shown in FIG. 4, a terminal device of one preferred embodiment for an electrical connection includes an electroconductive pin 12 which is slidably inserted into a fine insulating housing 11 being made of plastic or the like. The insulating housing 11 is conical and has a flange 11a for placing fingers near the rear end portion. A hook-shaped terminal section 13 is provided at the front end of the electroconductive pin 12 which can retractably move in and out at a first end of the insulating housing 11.

A compression coil spring 14 or the like is provided for urging electroconductive pin 12 toward the first end of the insulating housing 11, whereby a hook-shaped terminal portion 13 of the electroconductive pin 12 is urged to retract towards the first end of the insulating housing 11. The terminal device of the invention further includes a spring bearing 15 which is contracted toward the rear end of the spring 14 and may be integrated with the electroconductive pin 12. The rear end of the electroconductive pin 12 is also integrated with the pusher 17, where a bore 16 is provided for a coaxial cable 21 for connecting the electroconductive pin 12.

A fixed terminal 18 is provided at the front of the insulating housing 11 so as to oppose the inner surface of the hook-shaped terminal portion 13. The fixed terminal 18 further includes a pin-shaped conductor 18A which is embedded in the insulating housing 11. Lead wires 19 and 20 are respectively connected to the electroconductive pin 12 and pin-shaped conductor 18A inside the rear end of the insulating housing 11. The other end of lead wires 19 and 20 are respectively connected to a current supply terminal and a voltage measuring terminal of the measuring apparatus (not shown). Lead wires 19 and 20 make up a single coaxial cable. In FIG. 4, the lead wire 19 which is connected to the electroconductive pin 12 is an outer conductor of the cable 21, while the pin-shaped conductor 18A is a central conductor of the cable 21. However, the lead wire 19 and pin-shaped conductor 18A may be switched in an alternative embodiment. Any electrical interaction between the two lead wires is eliminated to optimize the electric characteristics of the terminal device. If there is no adverse change in electric characteristics, each of lead wires 19 and 20 may be replaced by a non-coaxial wiring.

In one preferred embodiment, a connection of the terminal device to the DUT is realized by extending the hook-shaped terminal section 13 of the electroconductive pin 12 from the insulating housing 11 against the elastic force of a spring so as to engage the hook-shaped terminal section 13 with the lead section 6 to be measured of the DUT. This operation is achieved by pressing the flange 11a of the insulating housing 11 towards the pusher 17 at the rear end of the electroconductive pin 12. After the hook-shaped terminal portion 13 is engaged with the lead section 6 to be measured, a force applied to the pusher 17 is released, and the lead section to be measured is urged by the hook-shaped terminal section 13 and the fixed terminal 18 which opposes the hook-shaped terminal portion 13.

Figure 5:
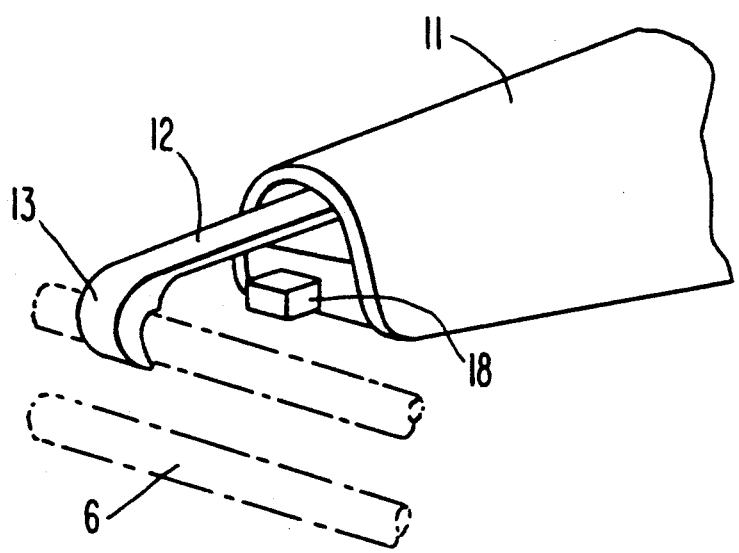
FIG. 5 is a perspective view of the tip portion of the terminal device as shown in FIG. 4.

A connection to the lead section 6 to be measured is made at one particular point for both the electrical supply section and the measuring section of the measuring apparatus via lead wires 19 and 20, the electroconductive pin 12 and the pin-shaped conductor 18A. Accordingly, even if a space between the two lead sections 6 to be measured is close, the hook-shaped terminal section 13 can engage the lead section 6 to be measured without difficulty as shown in FIG. 5. Furthermore, since the Kelvin connection is achieved by the one-point connection, an efficiency for the LCR measurement is enhanced.

In the above described embodiment the fixed terminal 18 has a pin shape and is embedded in the insulating housing 11. However, it should be understood that the conductor 18A of the present invention is not limited to this shape. Any means can be used in place of the fixed terminal 18 if a sufficient electric contact to lead section 6 to be measured is obtained. For example, one alternative embodiment is a plated metal on the surface of the insulating housing 11, and the conductor 18A is electrically connected to the metal-plated region by means of press-contact, soldering or the like. Since the conductor 18A is not necessarily required to have rigidity, a typical flexible wire can be used with the rigid insulating insulting housing 11.

Figure 6:
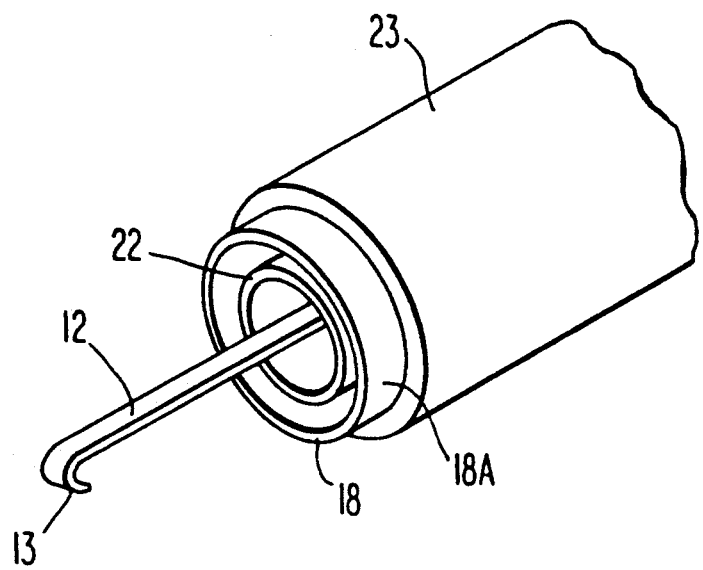
FIG. 6 is a perspective view of another embodiment of this invention in which an electroconductive pin and a lead wire are provided in the form of a coaxial structure.

Furthermore, in another embodiment shown in FIG. 6, the conductor 18A forms a hollow cylinder surrounding the electroconductive pin 12, and an insulating layer 23 is provided over the hollow cylindrical conductor 18A. An edge of the hollow cylindrical conductor 18A serves as a fixed terminal 18. In addition, an insulating hollow cylinder 22 may also be provided between the hollow cylindrical conductor 18A and the electroconductive pin 12 to form a coaxial structure. Since the electroconductive pin 12 and the conductor 18A are electrically isolated, the electric characteristics are highly improved.

Figure 7:
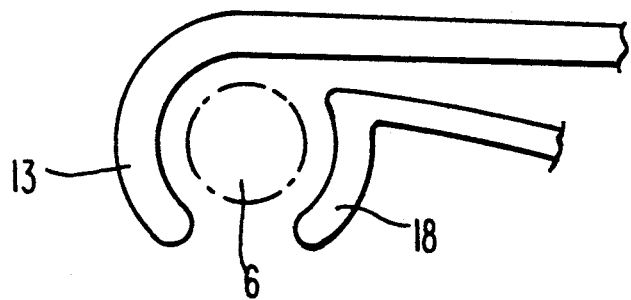
FIG. 7 is a cross-sectional view of the tip portion of terminal device of another embodiment in which a fixed terminal is also curved so as to correspond to the shape of the hook-shaped terminal portion around the electroconductive pin.

Various modifications of the present invention are possible. For example, the fixed terminal 18 may be designed in a curved shape which corresponds to the shape of the hook-shaped terminal portion 13 as shown in FIG. 7. Also the hook-shaped terminal section 13 may be designed by just bending a tip of the electroconductive pin 12 having a uniform thickness at a right angle. The true scope of the present invention is not limited to the specific examples described above but rather is set forth in the following claims

What is claimed is:

1. A terminal device for making an electrical connection to a device under test, comprising:
   an insulating housing;
   a first electroconductive pin being slidably inserted into said insulating housing, said first electroconductive pin including a hook-shaped terminal section provided at one end of said first electroconductive pin, and said first electroconductive pin being urged by a spring in such a direction that said hook-shaped terminal section is retracted towards one end of said insulating housing;
   a fixed electrical conductive terminal located at said one end of said insulating housing to oppose an inner surface of said hook-shaped terminal section;
   a pusher slidably located at another end of said insulating housing for anchoring said first electroconductive pin; and
   a pair of lead wires being respectively connected to said first electroconductive pin and said fixed terminal at another end of said insulating housing.

2. A terminal device for an electrical connection as recited in claim 1, wherein said insulating housing further includes a flange disposed at an outer surface of said insulating housing for providing a finger contact surface to apply a manual force to said spring for moving said hook-shaped terminal away from said one end of said insulating housing.

3. A terminal device for an electrical connection as recited in claim 1, wherein said fixed terminal further comprises a second electroconductive pin extending from an inside of said insulating housing to oppose the inner surface of said hook-shaped terminal section.

4. A terminal device for an electrical connection as recited in claim 3, wherein said second electroconductive pin is embedded within said insulating housing.

5. A terminal device for an electrical connection as recited in claim 1, wherein said fixed terminal further comprises an electroconductive cylinder, said insulating housing surrounding said electroconductive cylinder except for a portion of said electroconductive cylinder serving as said fixed terminal, said electroconductive pin being disposed in said cylinder.

6. A terminal device for an electrical connection as recited in claim 5, further comprising a cylinder of insulting material extending through the inside of said electroconductive cylinder to form a coaxial structure.

* * * * *